United States Patent
Maeda et al.

(10) Patent No.: US 7,982,361 B2
(45) Date of Patent: Jul. 19, 2011

(54) ACTUATOR USING COMB-TOOTH

(75) Inventors: Takanori Maeda, Saitama (JP);
Hirokazu Takahashi, Saitama (JP);
Masahiro Ishimori, Saitama (JP)

(73) Assignee: Pioneer Corporation, Tokyo (JP)

( * ) Notice: Subject to any disclaimer, the term of this patent is extended or adjusted under 35 U.S.C. 154(b) by 357 days.

(21) Appl. No.: 12/295,027

(22) PCT Filed: Mar. 30, 2007

(86) PCT No.: PCT/JP2007/057145
§ 371 (c)(1),
(2), (4) Date: Dec. 5, 2008

(87) PCT Pub. No.: WO2007/114354
PCT Pub. Date: Oct. 11, 2007

(65) Prior Publication Data
US 2009/0273255 A1 Nov. 5, 2009

(30) Foreign Application Priority Data
Mar. 31, 2006 (JP) .................................. 2006-100634

(51) Int. Cl.
*H02N 1/00* (2006.01)
(52) U.S. Cl. ................... 310/309; 369/44.16; 369/47.49
(58) Field of Classification Search .................. 310/309; 369/44.16, 44.32, 47.49; 74/471 XY
See application file for complete search history.

(56) References Cited

U.S. PATENT DOCUMENTS

| 6,078,016 A * | 6/2000 | Yoshikawa et al. ............ 200/181 |
| 6,587,408 B1 * | 7/2003 | Jacobson et al. ............ 369/44.16 |
| 6,624,548 B1 * | 9/2003 | Miller et al. .................. 310/307 |
| 2009/0273255 A1 * | 11/2009 | Maeda et al. ................. 310/308 |

FOREIGN PATENT DOCUMENTS

| JP | 4-325882 | 11/1992 |
| JP | 9-178494 | 7/1997 |
| JP | 2003-529108 | 9/2003 |

OTHER PUBLICATIONS

International Search Report for PCT/JP2007/057145 mailed Jul. 3, 2007.

* cited by examiner

*Primary Examiner* — Karl I Tamai
(74) *Attorney, Agent, or Firm* — Nixon & Vanderhye P.C.

(57) ABSTRACT

An actuator comprises a connection section having one end rotatably connected to a connection point (C1) of a fixed section and the other end rotatably connected to a connection point (C2) of a moving section, a connection section having one end rotatably connected to a connection point (C3) of the fixed section and the other end rotatably connected to a connection point (C4) of the moving sections a comb-teeth electrode having the root section connected to a comb-teeth base point (B1) and the fore-end section extending along the turning path, and a comb-teeth electrode having the root section connected to the fixed section and the other section extending along the curve of the comb-teeth electrode and opposed to the comb-teeth electrode with a predetermined gap.

22 Claims, 9 Drawing Sheets

[FIG. 1]
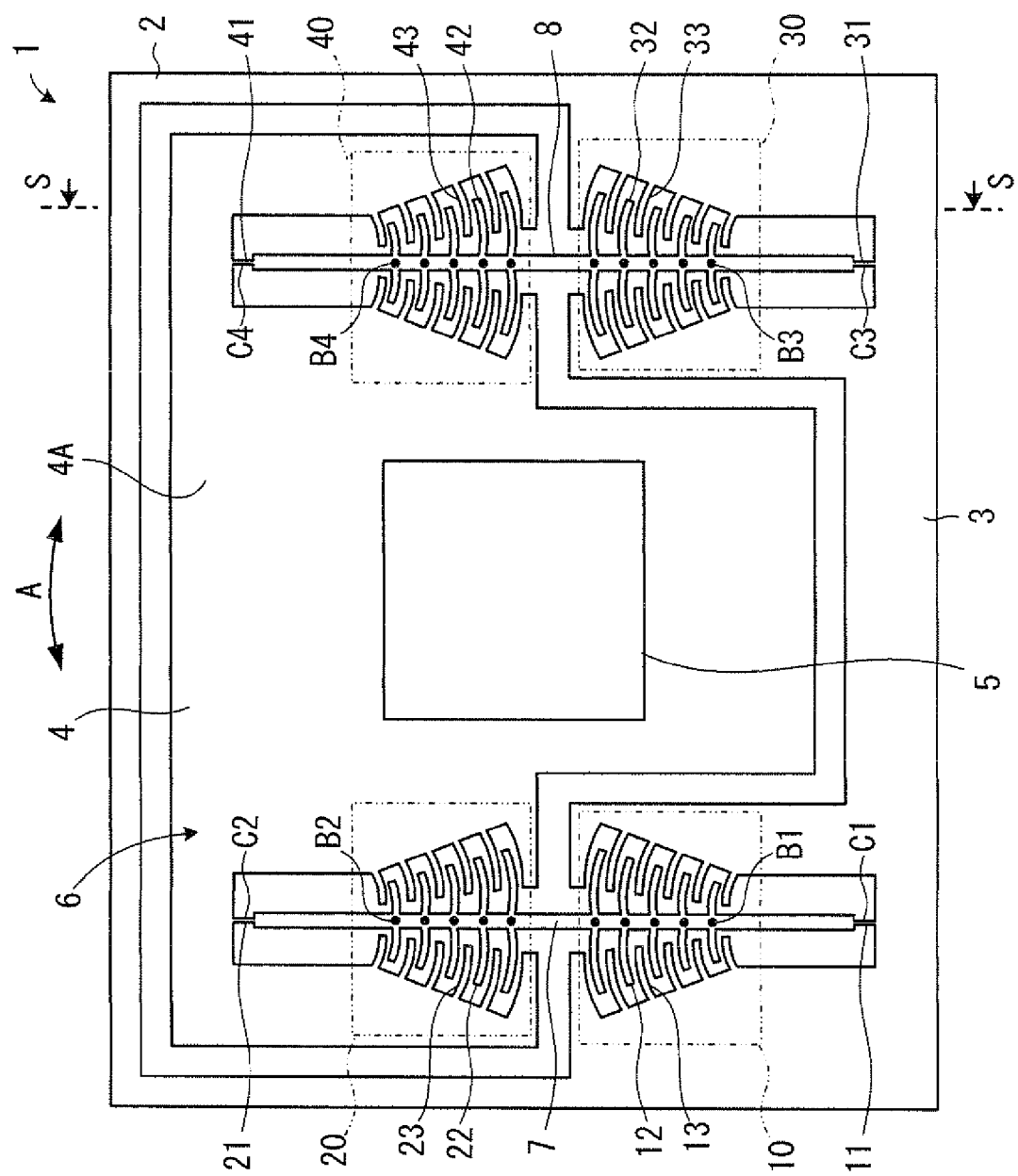

[FIG. 2]
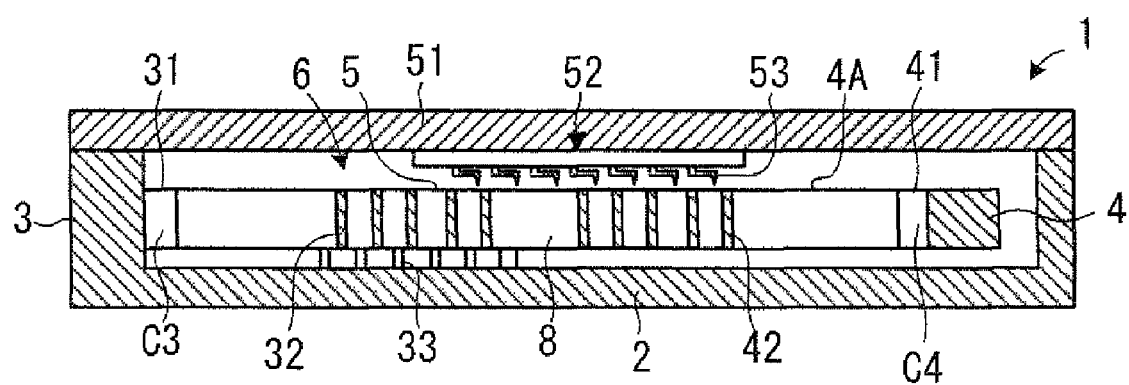

[FIG. 3]
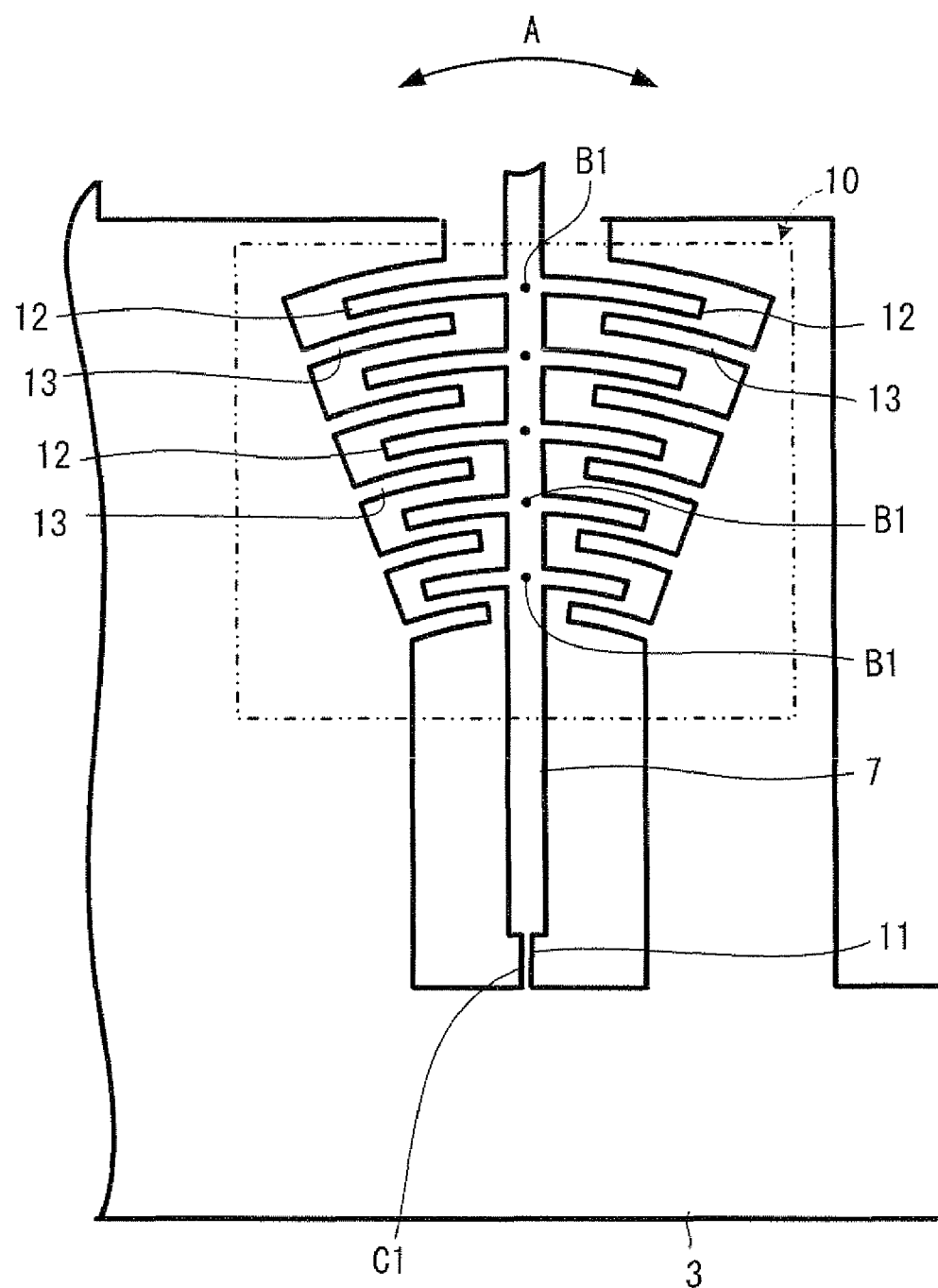

[FIG. 4]
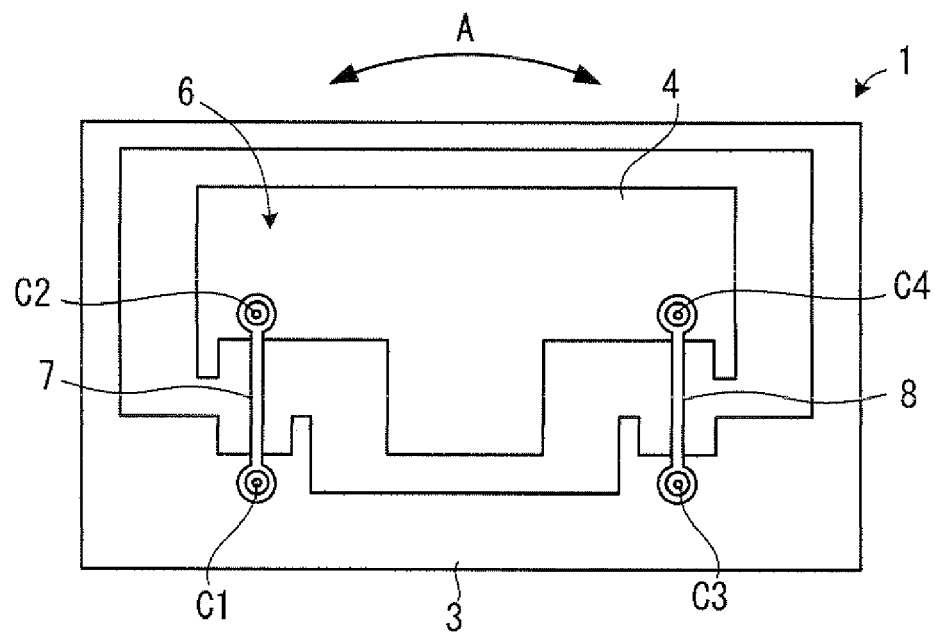
[FIG. 5]
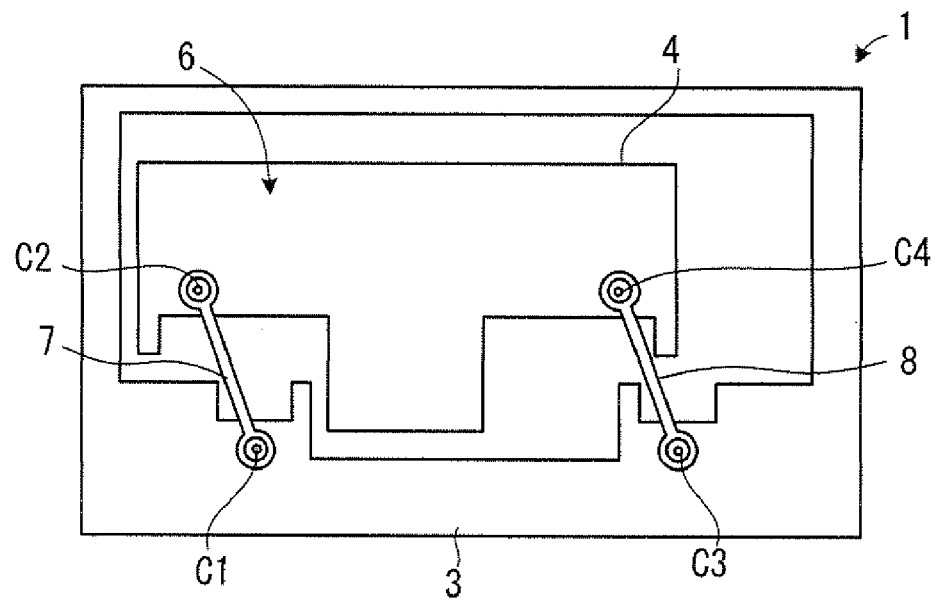

[FIG. 6]
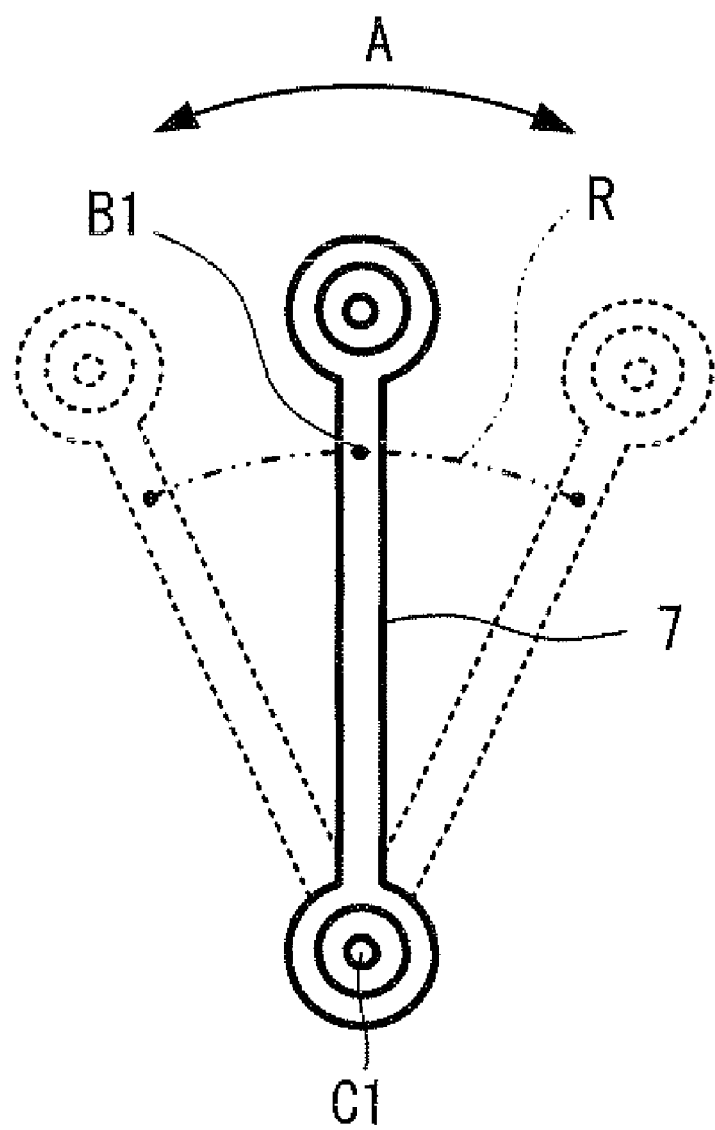

[FIG. 7]
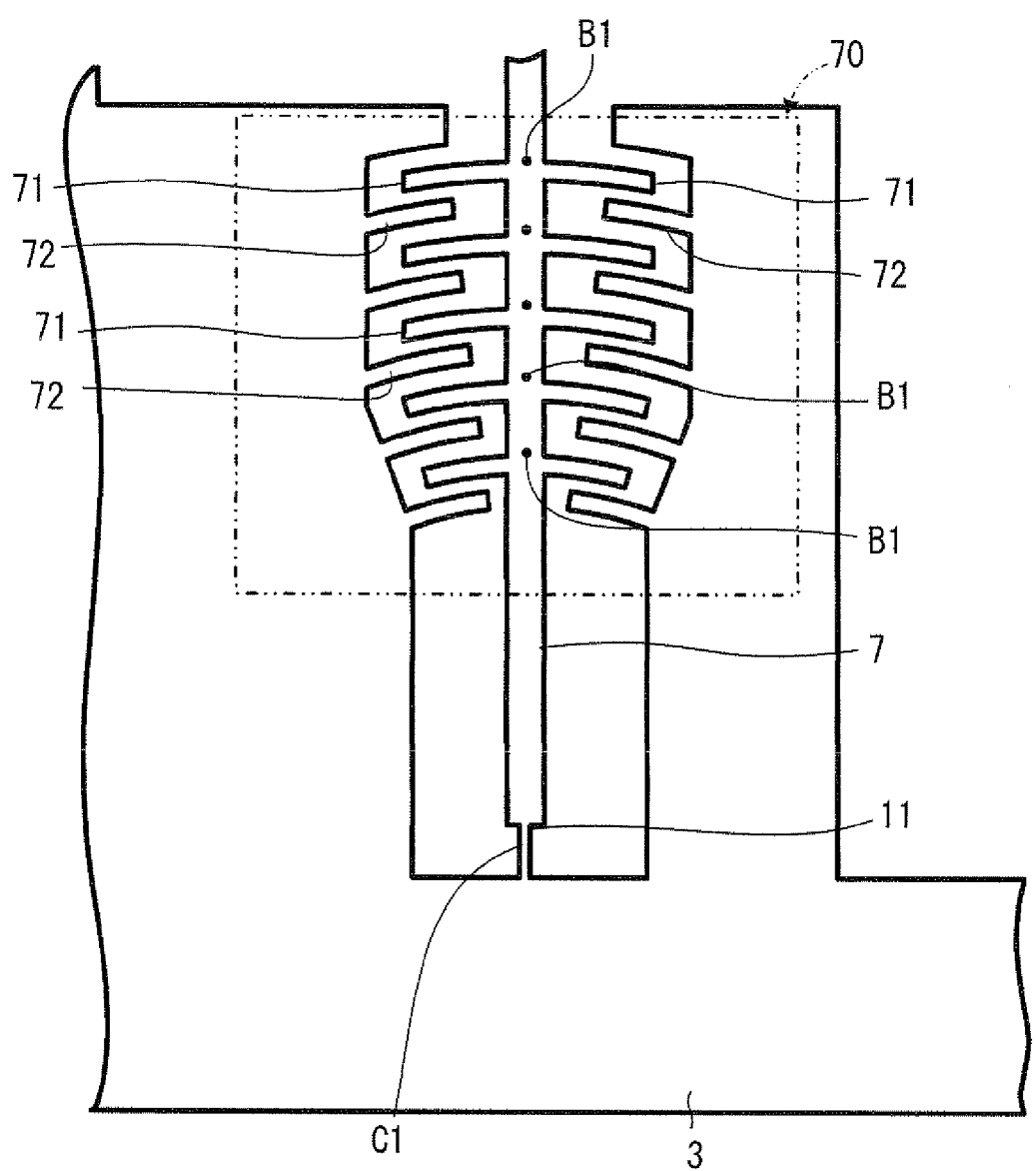

[FIG. 8]
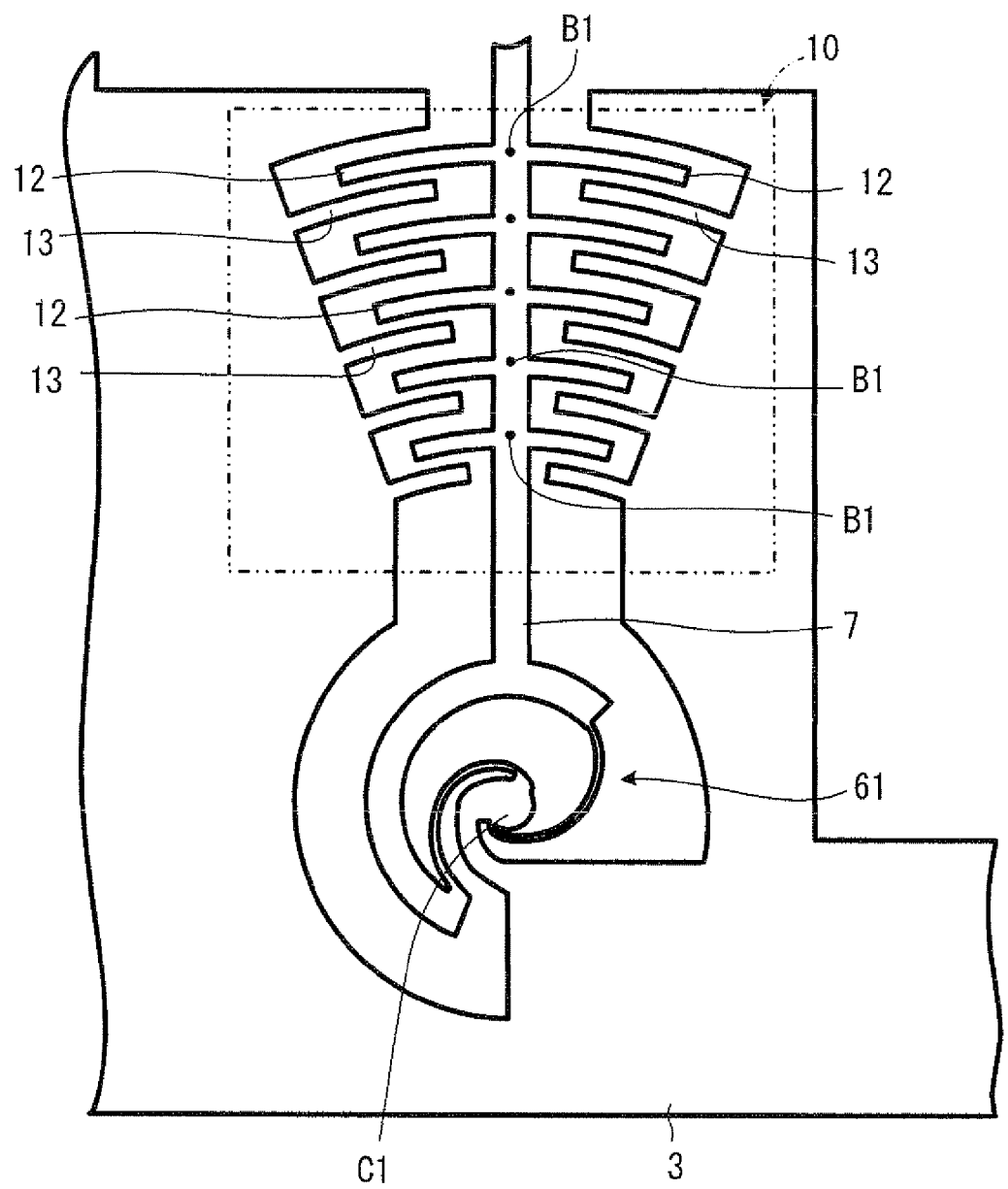

[FIG. 9]
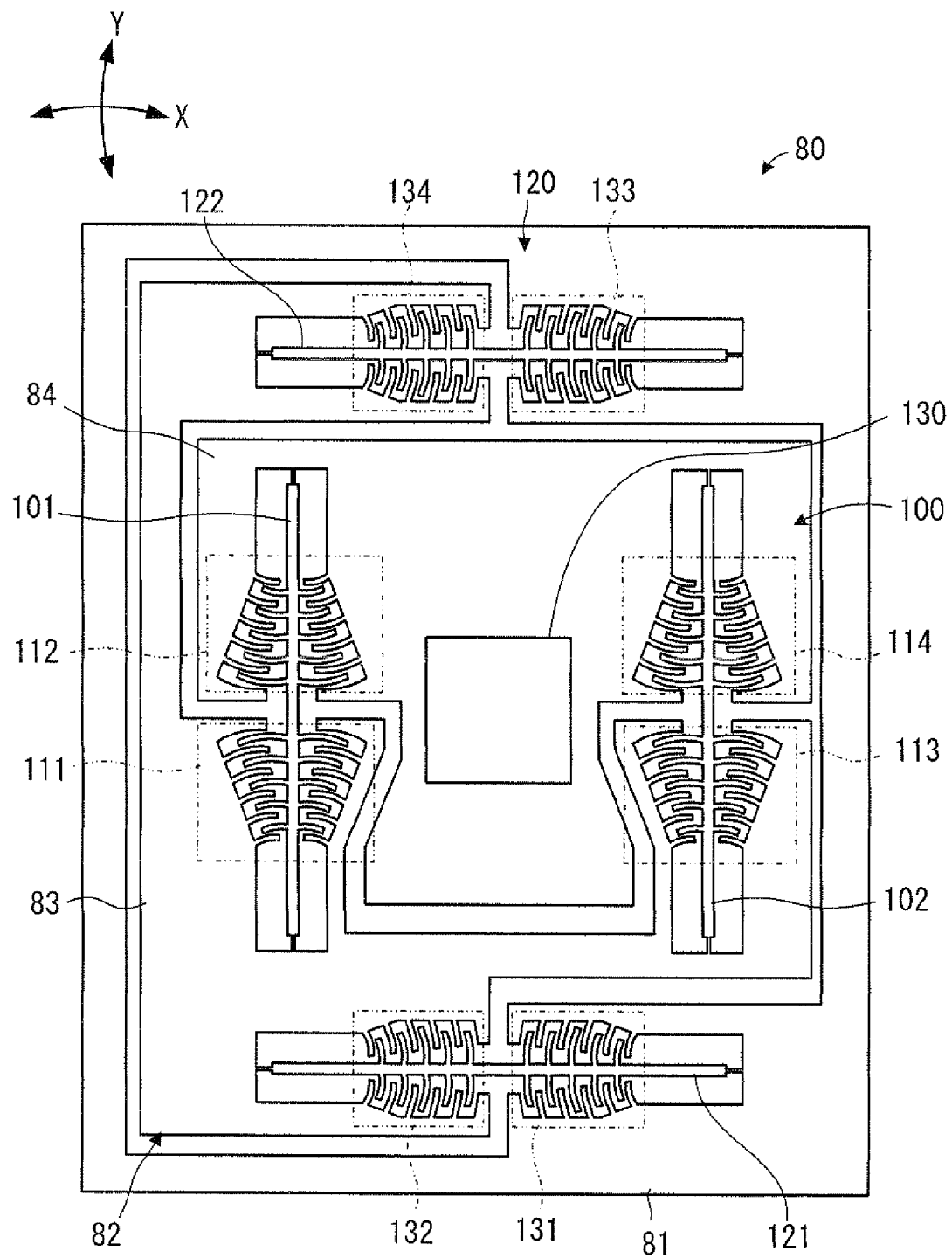

[FIG. 10]
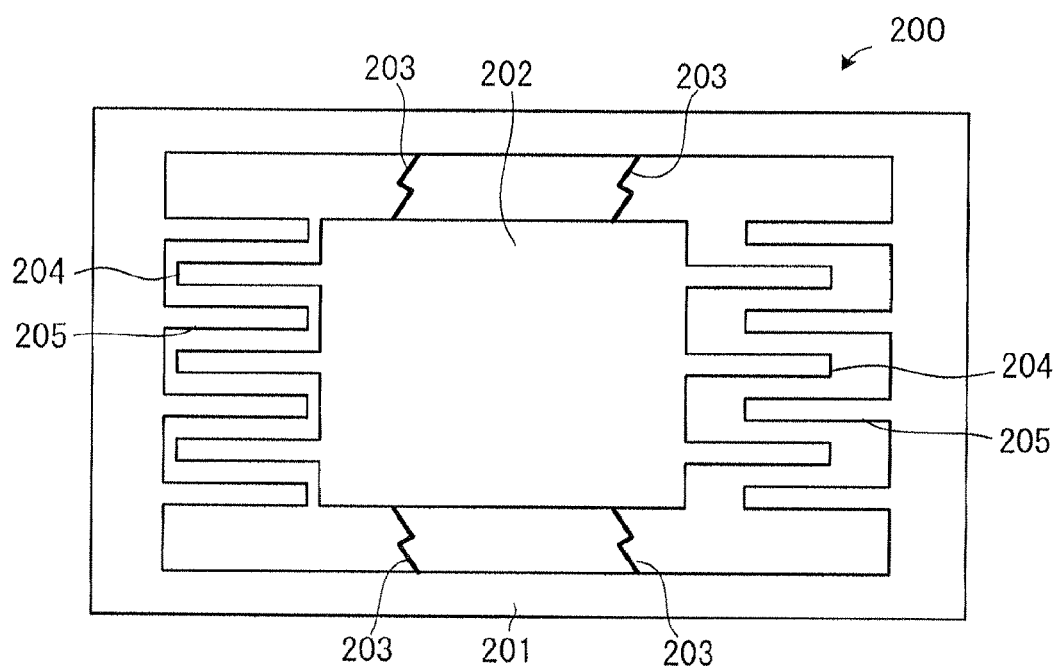
PRIOR ART

ACTUATOR USING COMB-TOOTH

This application is the U.S. national phase of International Application No. PCT/JP2007/057145 filed 30 Mar. 2007 which designated the U.S. and claims priority to Japanese Patent Application No. 2006-100634 filed 31 Mar. 2006, the entire contents of each of which are hereby incorporated by reference.

TECHNICAL FIELD

The present invention relates to an actuator suitably used for a scanning probe memory apparatus, for example.

BACKGROUND ART

As a small-sized information memory apparatus capable of recording information highly densely a scanning probe memory apparatus is listed.

The recording/reproducing principle of the scanning probe memory apparatus has various types: using a tunnel effect, using an atomic force, using a magnetic force, using an electrostatic force, using a non-linear dielectric constant, and using heat deformation of a recording medium.

The scanning probe memory apparatus is normally provided with: a probe having a tip with a radius of about several tens nanometers to several micrometers; and a plate-like (or flat) recording medium having a recording surface formed on its surface. The scanning probe memory apparatus brings the tip of the probe closer to or into contact with the recording surface of the recording medium, to thereby perform information recording or reading on the recording medium.

Moreover, the scanning probe memory apparatus displaces the probe or the recording medium in a parallel direction to the recording surface, to thereby change the positional relation between the probe and the recording medium. By this, it is possible to scan the recording surface of the recording medium, using the probe, so that a large amount of information can be arranged on the recording surface, highly densely. Alternatively, the large amount of information arranged on the recording surface can be read, continuously or randomly.

Moreover, most scanning probe memory apparatuses adopt a multi-probe method. That is, most scanning probe memory apparatuses are provided with: a two-dimensional probe head in which several tens, or several hundreds, or several thousands of probes are arranged in a matrix, for example. By using such a probe head, it is possible to quickly record the large amount of information onto the recording medium, or it is possible to quickly read the large amount of information from the recording medium.

DISCLOSURE OF INVENTION

Subject to be Solved by the Invention

As explained above, in order to realize the scanning of the recording surface with the probe, the scanning probe memory apparatus displaces the probe head or the recording medium in the parallel direction to the recording surface.

As one method of displacing the probe head or the recording medium in the parallel direction to the recording surface, there is listed a method of displacing the probe head or the recording medium, substantially linearly, in a horizontal direction or cross direction (or front-back direction) along the recording surface.

Moreover, as one actuator for creating a driving force to displace the probe head or the recording medium by the above method, there is listed an electrostatically-driven actuator. The electrostatically-driven actuator is a micro actuator and uses an electrostatic force generated between comb tooth-like or pectinate electrodes facing each other through a vacant space, to thereby create the driving force to displace the probe head or the recording medium.

Now, a general system is introduced, which uses the electrostatically-driven actuator to reciprocate the recording medium linearly in the horizontal direction along the recording surface. Hereinafter, this is referred to as a "general system of the electrostatically-driven actuator". Incidentally, the following explanation enables a deepening of understanding with reference to a general system 200 of an electrostatically-driven actuator in FIG. 10.

Firstly, a hollow housing is formed. Then, the recording medium is disposed within the housing.

In order to enable the recording medium to be reciprocated, it is necessary to float the recording medium within the housing. In order to realize this, several supporting points are set on the side surfaces of the recording medium. Then, several thin plate springs, obtained by processing silicon in a plate shape, or the like are prepared. Then, one end of the plate spring is connected to the supporting point of the recording medium, and the other end of the plate spring is connected to the inner wall surface of the housing. In this manner, the recording medium is substantially floated within the housing.

Moreover, it is necessary to regulate the reciprocation direction of the recording medium to the linearly horizontal direction. In order to realize this, the position of the supporting points for supporting the recording medium with the plate springs, the extending direction or bending direction of the plate springs, and the like are set closely.

For example, the supporting points of the recording medium are disposed highly accurately to be line-symmetric with respect to the linear direction in which the recording medium reciprocates. Moreover, the plate springs are disposed highly accurately to be line-symmetric with respect to the linear direction in which the recording medium reciprocates. Moreover, the shapes of the plate springs and spring constants are uniformed, highly accurately.

Moreover, in order to create the driving force to reciprocate the recording medium, it is necessary to form a comb tooth-like electrode mechanism. In order to realize this, a comb tooth-like electrode is mounted on the side surface located on the left side of the recording medium. On the other hand, a comb tooth-like electrode is also mounted on the inner wall side of the housing facing the left side surface of the recording medium. The, the comb tooth-like electrode mounted on the recording medium and the comb tooth-like electrode mounted on the housing are disposed to engage each other through a small vacant space. This type of comb tooth-like electrode mechanism is provided on the right side of the recording medium.

Each comb tooth-like electrode has a shape to extend linearly along the reciprocation direction of the recording medium.

When the recording medium is displaced to the left, a voltage is applied between the comb tooth-like electrodes facing each other in the comb tooth-like electrode mechanism provided on the left side of the recording medium. By this, an electrostatic force is generated between the comb tooth-like electrodes, and the recording medium is pulled or attracted to the left by the electrostatic force.

On the other hand, when the recording medium is displaced to the right, a voltage is applied between the comb tooth-like electrodes facing each other in the comb tooth-like electrode mechanism provided on the right side of the recording medium. By this, an electrostatic force is generated between the comb tooth-like electrodes, and the recording medium is pulled to the right by the electrostatic force.

By repeating the voltage application between the comb tooth-like electrodes provided on the left side of the recording medium and the comb tooth-like electrodes provided on the right side of the recording medium, it is possible to reciprocate the recording medium, linearly in the horizontal direction.

By the way, the general system of the electrostatically-driven actuator described above has the following problem.

In the general system of the electrostatically-driven actuator, in order to regulate the reciprocation direction of the recording medium to the linearly horizontal direction, the position of the supporting points for supporting the recording medium with the plate springs, the extending direction or bending direction of the plate springs, and the like are set closely.

However, the electrostatic force between the comb tooth-like electrodes facing each other is also generated in a direction crossing the reciprocation direction of the recording medium. Thus, in some cases, the recording medium is displaced in the cross direction (or front-back direction) against the regulation by the plate springs, for example.

The displacement of the recording medium in the cross direction may cause the contact of the comb tooth-like electrodes facing each other. The contact of the comb tooth-like electrodes impairs the driving force to reciprocate the recording medium in the horizontal direction (pull-in phenomenon).

Moreover, such a phenomenon tends to occur if the distance of the reciprocation of the recording medium is increased. Thus, if the electrostatically-driven actuator is used, there is such a problem that it is hard to increase the reciprocation distance (stroke amount) of the recording medium.

In view of the aforementioned problems, it is therefore a first object of the present invention to provide an electrostatically-driven actuator capable of preventing the contact of comb tooth-like electrodes facing each other through a vacant space.

Moreover, it is a second object of the present invention to provide an electrostatically-driven actuator capable of increasing the stroke amount of the reciprocation of a displaced object, such as a probe head or a recording medium.

Means for Solving the Subject

The above object of the present invention can be achieved by a first actuator for displacing a moving device in a predetermined direction with respect to a fixing device, provided with: a first coupling device whose one edge side is rotatably connected to a first connection point disposed on the fixing device and whose other edge side is rotatably connected to a second connection point disposed on the moving device; a second coupling device whose one edge side is rotatably connected to a third connection point disposed on the fixing device and whose other edge side is rotatably connected to a fourth connection point disposed on the moving device; a first comb tooth-like base point disposed on the first coupling device; a first comb tooth whose rear anchor side is connected to the first comb tooth-like base point and whose tip side extends along a rotational trajectory of the first comb tooth-like base point drawn by rotation around the first connection point of the first coupling device; and a second comb tooth whose rear anchor side is connected to the fixing device and whose tip side extends in accordance with a curve of the first comb tooth, the second comb tooth facing the first comb tooth at a predetermined interval, a length between the first connection point and the second connection point being equal to a length between the third connection point and the fourth connection point, a length between the first connection point and the third connection point being equal to a length between the second connection point and the fourth connection point.

The above object of the present invention can be also achieved by a second actuator for displacing a moving device in a predetermined direction with respect to a fixing device, provided with: a coupling device whose one edge side is rotatably connected to a first connection point disposed on the fixing device and whose other edge side is rotatably connected to a second connection point disposed on the moving device; a first comb tooth-like base point disposed on the coupling device; a first comb tooth whose rear anchor side is connected to the first comb tooth-like base point and whose tip side extends along a rotational trajectory of the first comb tooth-like base point drawn by rotation around the first connection point of the coupling device; a second comb tooth whose rear anchor side is connected to the fixing device and whose tip side extends in accordance with a curve of the first comb tooth, the second comb tooth facing the first comb tooth at a predetermined interval; a second comb tooth-like base point disposed on the coupling device; a third comb tooth whose rear anchor side is connected to the second comb tooth-like base point and whose tip side extends along a rotational trajectory of the second comb tooth-like base point drawn by rotation around the second connection point of the coupling device; and a fourth comb tooth whose rear anchor side is connected to the moving device and whose tip side extends in accordance with a curve of the third comb tooth, the fourth comb tooth facing the third comb tooth at a predetermined interval.

The above object of the present invention can be also achieved by a actuator system provided with: a fixing device; a moving device provided with a fixing block and a moving block; a first actuator for displacing the moving device in a first direction with respect to the fixing device; and a second actuator for displacing the moving block in a second direction crossing the first direction in the same plane, with respect to the fixing block, wherein the first actuator and the second actuator being the actuator according to any one of claims 1 to 22.

These effects and other advantages of the present invention will become more apparent from the embodiments explained below.

BRIEF DESCRIPTION OF DRAWINGS

FIG. 1 is a plan view showing the inside of a scanning probe memory apparatus equipped with the actuator of the present invention.

FIG. 2 is a cross sectional view showing the scanning probe memory apparatus in FIG. 1, viewed from an arrow S-S direction.

FIG. 3 is an enlarged diagram showing one portion of the actuator in FIG. 1.

FIG. 4 is an explanatory diagram schematically showing the displacement of a moving device with respect to a fixing device in FIG. 1.

FIG. 5 is an explanatory diagram schematically showing the displacement of a moving device with respect to a fixing device in FIG. 1.

FIG. 6 is an explanatory diagram showing a rotational trajectory of a comb tooth-like base point.

FIG. 7 is a plan view showing an actuator in another embodiment of the present invention.

FIG. 8 is a plan view showing an actuator in another embodiment of the present invention.

FIG. 9 is a plan view showing the inside of a scanning probe memory apparatus equipped with an actuator system in an embodiment of the present invention.

FIG. 10 is an explanatory diagram showing a general system of an electrostatically-driven actuator.

DESCRIPTION OF REFERENCE CODES 3, 81 fixing device
4, 82 moving device
6, 100, 120 actuator
7, 8, 101, 102, 121, 122 coupling device
12, 13, 22, 23, 32, 33, 42, 43, 71, 72 comb tooth-like electrode

BEST MODE FOR CARRYING OUT THE INVENTION

Hereinafter, the best mode for carrying out the invention will be explained in each embodiment in order, with reference to the drawings.

Embodiment of Actuator

FIG. 1 shows the inside of a scanning probe memory apparatus equipped with an actuator in an embodiment of the present invention. FIG. 2 shows a cross section of a probe memory apparatus 1 in FIG. 1, viewed from an arrow S-S direction. FIG. 3 enlarges and shows one portion of an actuator 6 in FIG. 1. Incidentally, FIG. 1 shows the probe memory apparatus 1, with a lid 51 and a probe head 52 in FIG. 2 removed.

The probe memory apparatus 1 is a small-sized apparatus, for example, which is several millimeters to several centimeters in length and in width (length in a horizontal direction and a vertical direction in FIG. 1) and which is several millimeters in thickness (length in a vertical direction in FIG. 2), in outside dimension.

As shown in FIG. 1, the probe memory apparatus 1 is provided with: a housing 2; a fixing device 3; a moving device 4; a recording medium 5; and an actuator 6. Moreover, as shown in FIG. 2, the probe memory apparatus 1 is provided with a lid 51; a probe head 52; and probes 53.

The housing 2 is formed of a silicon material in a cup shape, and has a space formed inside.

The fixing device 3 is formed in a unified manner with one portion of the side wall of the housing 2.

The moving device 4 is formed of a silicon material in a plate shape. The moving device 4 is accommodated in the space formed inside of the housing 2. Moreover, the moving device 4 is supported by the fixing device 3 movably in a parallel direction (an arrow A direction in FIG. 1) to an upper surface 4A of the moving device 4. As shown in FIG. 2, a lower surface of the moving device 4 is away from the bottom plate upper surface of the housing 2. Moreover, each side surface of the moving device 4 is away from the side wall inner surface of the housing 2, except the portion supported by the fixing device 3. Moreover, the recording medium 5 is fixed in substantially the center of the upper surface 4A of the moving device 4. The recording medium 5 is, for example, a square about 20 mm on a side, in outside dimension. The moving device 4 is displaced in the arrow A direction by the drive of the actuator 6.

On the other hand, as shown in FIG. 2, the lid 51 is fixed in the upper portion of the housing 2.

The probe head 52 is located on the upper side of the recording medium 5, and is fixed on the lower surface of the lid 51. The probe head 52 is provided with several hundreds of probes 53, for example. In the probe head 52, the interval of the tips of adjacent probes 53 is about several tens μm to several hundreds μm, for example. Moreover, the tip diameter of each probe 53 is several tens nm, for example.

The probe memory apparatus 1 can record information onto the recording medium, highly densely, through the probes 53, and has a huge recording capacity regardless of its small size. When recording the information onto the recording medium 5, the probe memory apparatus 1 brings the tips of the probes 53 closer to or into contact with the recording surface of the recording medium 5, and applies a voltage or heat or the like to the recording medium 5 from the tips of the probes 53, in accordance with an information recording principle adopted for the probe memory apparatus 1.

Moreover, when recording the information onto the recording medium 5, the probe memory apparatus 1 drives the actuator 6 and displaces the moving device 4 in the arrow A direction with respect to the fixing device 3. By this, the recording medium 5 moves in the parallel direction to its recording surface, with respect to the fixed probes 53. By this, the scanning of the recording surface of the recording medium 5 by the probes 53 is realized.

Incidentally, in general, the recording/reproducing principle that the scanning probe memory apparatus can adopt has various types: using a tunnel effect, using an atomic force, using a magnetic force, using an electrostatic force, using a non-linear dielectric constant, and using heat deformation of a recording medium. The probe memory apparatus 1 can adopt any one of the recording/reproducing principles.

As shown in FIG. 1, the actuator 6 in the embodiment of the present invention is provided with: two coupling devices 7 and 8; and four comb tooth-like electrode mechanisms 10, 20, 30, and 40.

The coupling device 7 is disposed on the left side of the probe memory apparatus 1 and couples the fixing device 3 and the moving device 4. That is, the fixing device 3 has a connection point C1, and the moving device 4 has a connection point C2. The one edge side of the coupling device 7 is rotatably connected to the connection point C1. On the other hand, the other edge side of the coupling device 7 is rotatably connected to the connection point C2.

Specifically, the one edge of the coupling device 7 and the connection point C1 are connected to each other through a plate spring 11. The plate spring 11 rotates the coupling device 7 by a predetermined angle around the connection point C1 in the parallel direction to the upper surface 4A of the moving device 4, substantially. The rotation is realized by the deformation of the plate spring 11. The plate spring 11 only allows the coupling device 7 to rotate in this direction and does not allow the coupling device 7 to move in other directions. Incidentally, the strain of the plate spring 11 when the coupling device 7 rotates may cause the rotation center of the coupling device 7 to slightly move in accordance with the rotation; however, it is not a problem. The plate spring 11 rotates the coupling device 7 in a sense including the bias of the rotation center (which is the same for plate springs 21, 31, and 41 described later).

Moreover, the other edge of the coupling device 7 and the connection point C2 are connected to each other through a plate spring 21. The plate spring 21 rotates the coupling device 7 by a predetermined angle around the connection point C2 in the parallel direction to the upper surface 4A of the moving device 4, substantially. The rotation is realized by the deformation of the plate spring 21. The plate spring 21 only allows the coupling device 7 to rotate in this direction and does not allow the coupling device 7 to move in other directions.

The coupling device 8 is disposed on the right side of the probe memory apparatus 1 and couples the fixing device 3 and the moving device 4. That is, the fixing device 3 has a connection point C3, and the moving device 4 has a connection point C4. The one edge side of the coupling device 8 is rotatably connected to the connection point C3. On the other hand, the other edge side of the coupling device 8 is rotatably connected to the connection point C4.

Specifically, the one edge of the coupling device 8 and the connection point C3 are connected to each other through a plate spring 31. The plate spring 31 rotates the coupling device 8 by a predetermined angle around the connection point C3 in the parallel direction to the upper surface 4A of the moving device 4, substantially. The plate spring 31 only allows the coupling device 8 to rotate in this direction and does not allow the coupling device 8 to move in other directions.

Moreover, the other edge of the coupling device 8 and the connection point C4 are connected to each other through a plate spring 41. The plate spring 41 rotates the coupling device 8 by a predetermined angle around the connection point C4 in the parallel direction to the upper surface 4A of the moving device 4, substantially. The plate spring 41 only allows the coupling device 8 to rotate in this direction and does not allow the coupling device 8 to move in other directions.

The coupling device 7 and the plate springs 11 and 21 are formed in a unified manner by etching a silicon material, for example. Moreover, the coupling device 8 and the plate springs 31 and 41 are also formed in a unified manner by etching a silicon material, for example. The coupling devices 7 and 8 have sufficient strength not to deflect or bend under load or the like when the moving device 4 reciprocates in the arrow A direction.

Moreover, as shown in FIG. 1, the length between the connection points C1 and C2 is equal to the length between the connection points C3 and C4. Moreover, the length between the connection points C1 and C3 is equal to the length between the connection points C2 and C4. That is, if it is connected between the connection points C1 and C2, between the connection points C2 and C4, between the connection points C4 and C3, and between the connection points C3 and C1, then a parallelogram is formed.

The comb tooth-like electrode mechanism 10 is disposed between the fixing device 3 and the coupling device 7, as shown in FIG. 1. Moreover, the comb tooth-like electrode mechanism 10 is disposed between the connection points C1 and C2. Moreover, the comb tooth-like electrode mechanism 10 is provided with a plurality of comb tooth-like electrodes 12 and a plurality of comb tooth-like electrodes 13.

As shown in FIG. 3, a plurality of comb tooth-like base points B1 are disposed in a portion of the coupling device 7 where the comb tooth-like electrode mechanism 10 is disposed. Each comb tooth-like base point B1 is a conceptual reference point. The plurality of comb tooth-like base points B1 are arranged at even intervals along the extending direction of the coupling device 7. The interval between the adjacent comb tooth-like base points B1 matches the interval between the comb tooth-like electrodes 12 adjacent to each other in the extending direction of the coupling device 7.

Each comb tooth-like electrode 12 is disposed on the side surface of the coupling device 7. The rear anchor side of each comb tooth-like electrode 12 is connected to the comb tooth-like base point B1. On the other hand, the tip side of each comb tooth-like electrode 12 extends along a rotational trajectory R of the comb tooth-like base point B1 (refer to FIG. 6) drawn by the rotation around the connection point C1 of the coupling device 7.

In contrast, the rear anchor side of each comb tooth-like electrode 13 is connected to the fixing device 3. On the other hand, the tip side of each comb tooth-like electrode 13 extends in accordance with the curve of the comb tooth-like electrode 12 and faces each comb tooth-like electrode 12 at a certain interval. Specifically, the tip side of each comb tooth-like electrode 13 extends in a curved shape to maintain the certain interval between the comb tooth-like electrode 12 and the comb tooth-like electrode 13 facing in the extending direction of the coupling device 7.

Moreover, each comb tooth-like electrode 12 extends from the both right and left sides of the coupling device 7. Moreover, each comb tooth-like electrode 13 is also disposed in each of the right and left of the coupling device 7.

Moreover, the length increases in the extending direction of each comb tooth-like electrode 12, as the distance increases between the connection point C1 and the comb tooth-like base point B1 corresponding to the comb tooth-like electrode 12. Moreover, the length also increases in the extending direction of each comb tooth-like electrode 13, as the distance increases between the connection point C1 and the comb tooth-like electrode 13. By this, the comb tooth-like electrode mechanism 10 is in a skirt shape in the outside shape.

The comb tooth-like electrode mechanism 20 is disposed between the fixing device 4 and the coupling device 7, as shown in FIG. 1. Moreover, the comb tooth-like electrode mechanism 20 is disposed between the comb tooth-like electrode mechanism 10 and the connection point C2. Moreover, the comb tooth-like electrode mechanism 10 is provided with a plurality of comb tooth-like electrodes 22 and a plurality of comb tooth-like electrodes 23.

A plurality of comb tooth-like base points B2 are disposed in a portion of the coupling device 7 where the comb tooth-like electrode mechanism 20 is disposed. Each comb tooth-like base point B2 is a conceptual reference point. The plurality of comb tooth-like base points B2 are arranged at even intervals along the extending direction of the coupling device 7. The interval between the adjacent comb tooth-like base points B2 matches the interval between the comb tooth-like electrodes 22 adjacent to each other in the extending direction of the coupling device 7.

Each comb tooth-like electrode 22 is disposed on the side surface of the coupling device 7. The rear anchor side of each comb tooth-like electrode 22 is connected to the comb tooth-like base point 132. On the other hand, the tip side of each comb tooth-like electrode 22 extends along a rotational trajectory of the comb tooth-like base point 132 drawn by the rotation around the connection point C2 of the coupling device 7.

In contrast, the rear anchor side of each comb tooth-like electrode 23 is connected to the moving device 4. On the other hand, the tip side of each comb tooth-like electrode 23 extends in accordance with the curve of the comb tooth-like electrode 22 and faces each comb tooth-like electrode 22 at a certain interval. Specifically, the tip side of each comb tooth-like electrode 23 extends in a curved shape to maintain the certain interval between the comb tooth-like electrode 22 and the comb tooth-like electrode 23 facing in the extending direction of the coupling device 7.

Moreover, each comb tooth-like electrode 22 extends from the both right and left sides of the coupling device 7. Moreover, each comb tooth-like electrode 23 is also disposed in each of the right and left of the coupling device 7.

Moreover, the length increases in the extending direction of each comb tooth-like electrode 22, as the distance increases between the connection point C2 and the comb tooth-like base point B2 corresponding to the comb tooth-like electrode 22. Moreover, the length also increases in the extending direction of each comb tooth-like electrode 23, as the distance increases between the connection point C2 and the comb tooth-like electrode 23. By this, the comb tooth-like electrode mechanism 20 is in a skirt shape in the outside shape.

The comb tooth-like electrode mechanism 30 is disposed between the fixing device 3 and the coupling device 8, as shown in FIG. 1. Moreover, the comb tooth-like electrode mechanism 30 is disposed between the connection points C3 and C4. Moreover, the comb tooth-like electrode mechanism 30 is provided with a plurality of comb tooth-like electrodes 32 and a plurality of comb tooth-like electrodes 33.

A plurality of comb tooth-like base points B3 are disposed in a portion of the coupling device 8 where the comb tooth-like electrode mechanism 30 is disposed. Each comb tooth-like base point B3 is a conceptual reference point. The plurality of comb tooth-like base points B3 are arranged at even intervals along the extending direction of the coupling device 8. The interval between the adjacent comb tooth-like base points B3 matches the interval between the comb tooth-like electrodes 32 adjacent to each other in the extending direction of the coupling device 8.

Each comb tooth-like electrode 32 is disposed on the side surface of the coupling device 8. The rear anchor side of each comb tooth-like electrode 32 is connected to the comb tooth-like base point B3. On the other hand, the tip side of each comb tooth-like electrode 32 extends along a rotational trajectory of the comb tooth-like base point B3 drawn by the rotation around the connection point C3 of the coupling device 8.

In contrast, the rear anchor side of each comb tooth-like electrode 33 is connected to the fixing device 3. On the other hand, the tip side of each comb tooth-like electrode 33 extends in accordance with the curve of the comb tooth-like electrode 32 and faces each comb tooth-like electrode 32 at a certain interval. Specifically, the tip side of each comb tooth-like electrode 33 extends in a curved shape to maintain the certain interval between the comb tooth-like electrode 32 and the comb tooth-like electrode 33 facing in the extending direction of the coupling device 8.

Moreover, each comb tooth-like electrode 32 extends from the both right and left sides of the coupling device 8. Moreover, each comb tooth-like electrode 33 is also disposed in each of the right and left of the coupling device 8.

Moreover, the length increases in the extending direction of each comb tooth-like electrode 32, as the distance increases between the connection point C3 and the comb tooth-like base point B3 corresponding to the comb tooth-like electrode 32. Moreover, the length also increases in the extending direction of each comb tooth-like electrode 33, as the distance increases between the connection point C3 and the comb tooth-like electrode 33. By this, the comb tooth-like electrode mechanism 30 is in a skirt shape in the outside shape.

The comb tooth-like electrode mechanism 40 is disposed between the fixing device 4 and the coupling device 8, as shown in FIG. 1. Moreover, the comb tooth-like electrode mechanism 40 is disposed between the comb tooth-like electrode mechanism 30 and the connection point C4. Moreover, the comb tooth-like electrode mechanism 40 is provided with a plurality of comb tooth-like electrodes 42 and a plurality of comb tooth-like electrodes 43.

A plurality of comb tooth-like base points B4 are disposed in a portion of the coupling device 8 where the comb tooth-like electrode mechanism 40 is disposed. Each comb tooth-like base point B4 is a conceptual reference point. The plurality of comb tooth-like base points B4 are arranged at even intervals along the extending direction of the coupling device 8. The interval between the adjacent comb tooth-like base points B4 matches the interval between the comb tooth-like electrodes 42 adjacent to each other in the extending direction of the coupling device 8.

Each comb tooth-like electrode 42 is disposed on the side surface of the coupling device 8. The rear anchor side of each comb tooth-like electrode 42 is connected to the comb tooth-like base point B4. On the other hand, the tip side of each comb tooth-like electrode 42 extends along a rotational trajectory of the comb tooth-like base point B4 drawn by the rotation around the connection point C4 of the coupling device 8.

In contrast, the rear anchor side of each comb tooth-like electrode 43 is connected to the moving device 4. On the other hand, the tip side of each comb tooth-like electrode 43 extends in accordance with the curve of the comb tooth-like electrode 42 and faces each comb tooth-like electrode 42 at a certain interval. Specifically, the tip side of each comb tooth-like electrode 43 extends in a curved shape to maintain the certain interval between the comb tooth-like electrode 42 and the comb tooth-like electrode 43 facing in the extending direction of the coupling device 8.

Moreover, each comb tooth-like electrode 42 extends from the both right and left sides of the coupling device 8. Moreover, each comb tooth-like electrode 43 is also disposed in each of the right and left of the coupling device 8.

Moreover, the length increases in the extending direction of each comb tooth-like electrode 42, as the distance increases between the connection point C4 and the comb tooth-like base point B4 corresponding to the comb tooth-like electrode 42. Moreover the length also increases in the extending direction of each comb tooth-like electrode 43, as the distance increases between the connection point C4 and the comb tooth-like electrode 43. By this, the comb tooth-like electrode mechanism 40 is in a skirt shape in the outside shape.

Each of the comb tooth-like electrodes 12 and 13 is about 50 μm in length (width) in the extending direction of the coupling device 7 and about 300 μm in thickness (length in the vertical direction in FIG. 2), for example. Each of the comb tooth-like electrodes 12, 13, 22, 23, 32, 33, 42, and 43 is formed in a method generally used in a MEMS (Micro Electro Mechanical System) technology, such as etching. Each of the comb tooth-like electrodes 12, 13, 32, and 33 is formed of a silicon material in a unified manner with the fixing device 3, for example. Each of the comb tooth-like electrodes 22, 23, 42, and 43 is formed of a silicon material in a unified manner with the moving device 4, for example.

FIG. 4 and FIG. 5 schematically show the displacement of the moving device 4 with respect to the fixing device 3.

As described above, the fixing device 3 and the moving device 4 are connected through the two coupling device 7 and 8. The coupling device 7 can be rotated around the connection point C1 with respect to the fixing device 3, and the coupling device 7 can be rotated around the connection point C2 with respect to the fixing device 4. Moreover, the coupling device 8 can be rotated around the connection point C3 with respect to the fixing device 3, and the coupling device 8 can be rotated around the connection point C4 with respect to the fixing device 4. Moreover, the length between the connection points C1 and C2 is equal to the length between the connection points C3 and C4. Moreover, the length between the connection points C1 and C3 is equal to the length between the connection points C2 and C4.

Therefore, as shown in FIG. 4, the moving device 4 can move so as to draw a gentle curve as shown in the arrow A direction, with respect to the fixing device 3. Moreover, even if the moving device 4 moves in the arrow A direction with respect to the fixing device 3, the moving device 4 itself does not incline. That is, the moving device 4 moves in parallel along the gentle curve shown in the arrow A. FIG. 5 shows that the moving device 4 moves in parallel to the left side along the arrow A; however, of course, the moving device 4 can move in parallel to the right side along the arrow A.

FIG. 6 shows the rotation of the coupling device 7 around the connection point C1 when the moving device 4 moves in the arrow A direction with respect to the fixing device 3.

When the moving device 4 moves in the arrow A direction with respect to the fixing device 3, the coupling device 7 rotates by a predetermined angle around the connection point C1, as shown in FIG. 6. When the coupling device 7 rotates by the predetermined angle around the connection point C1, the comb tooth-like base point B1 provided for the coupling device 7 is displaced to draw the rotational trajectory R. The tip of the comb tooth-like electrode 12 extends along the rotational trajectory R.

Back in FIG. 1, the operation of the actuator 6 will be explained.

A voltage is applied between the comb tooth-like electrodes 12 and 13 disposed on the lower left side of the coupling device 7. A voltage is applied between the comb tooth-like electrodes 22 and 23 disposed on the upper right side of the coupling device 7. A voltage is applied between the comb tooth-like electrodes 32 and 33 disposed on the lower left side of the coupling device 8. A voltage is applied between the comb tooth-like electrodes 42 and 43 disposed on the upper right side of the coupling device 8. By this, an electrostatic force is generated between the comb tooth-like electrodes to which the voltages are applied, and the facing comb tooth-like electrodes attract each other.

By such a force that the comb tooth-like electrodes 12 and 13, disposed on the lower left side of the coupling device 7, attract each other, the coupling device 7 rotates by a predetermined angle counterclockwise around the connection point C7. Simultaneously, by such a force that the comb tooth-like electrodes 22 and 23, disposed on the upper right side of the coupling device 7, attract each other, the coupling device 7 rotates by a predetermined angle counterclockwise around the connection point C2. By this, the coupling device 7 inclines by a predetermined angle counterclockwise with respect to the fixing device 3, and simultaneously, the moving device 4 rotates by a predetermined angle clockwise with respect to the coupling device 7. The inclination amount of the coupling device 7 with respect to the fixing device 3 is equal to the rotation amount of the moving device 4 with respect to the coupling device 7.

By such a force that the comb tooth-like electrodes 32 and 33, disposed on the lower left side of the coupling device 8, attract each other, the coupling device 8 rotates by a predetermined angle counterclockwise around the connection point C3. Simultaneously, by such a force that the comb tooth-like electrodes 42 and 43, disposed on the upper right side of the coupling device 8, attract each other, the coupling device 8 rotates by a predetermined angle counterclockwise around the connection point C4. By this, the coupling device 8 inclines by a predetermined angle counterclockwise with respect to the fixing device 3, and simultaneously, the moving device 4 rotates by a predetermined angle clockwise with respect to the coupling device 8. The inclination amount of the coupling device 8 with respect to the fixing device 3 is equal to the rotation amount of the moving device 4 with respect to the coupling device 8.

By the cooperation among the four pairs of comb tooth-like electrodes described above, the moving device 4 moves in parallel to the left along the gentle curve shown in the arrow A direction.

On the other hand, a voltage is applied between the comb tooth-like electrodes 12 and 13 disposed on the lower right side of the coupling device 7. A voltage is applied between the comb tooth-like electrodes 22 and 23 disposed on the upper left side of the coupling device 7. A voltage is applied between the comb tooth-like electrodes 32 and 33 disposed on the lower right side of the coupling device 8. A voltage is applied between the comb tooth-like electrodes 42 and 43 disposed on the upper left side of the coupling device 8. By this, an electrostatic force is generated between the comb tooth-like electrodes to which the voltages are applied, and the facing comb tooth-like electrodes attract each other.

By such a force that the comb tooth-like electrodes 12 and 13, disposed on the lower right side of the coupling device 7, attract each other, the coupling device 7 rotates by a predetermined angle clockwise around the connection point C1. Simultaneously, by such a force that the comb tooth-like electrodes 22 and 23, disposed on the upper left side of the coupling device 7, attract each other, the coupling device 7 rotates by a predetermined angle clockwise around the connection point C2. By this, the coupling device 7 inclines by a predetermined angle clockwise with respect to the fixing device 3, and simultaneously, the moving device 4 rotates by a predetermined angle counterclockwise with respect to the coupling device 7. The inclination amount of the coupling device 7 with respect to the fixing device 3 is equal to the rotation amount of the moving device 4 with respect to the coupling device 7.

By such a force that the comb tooth-like electrodes 32 and 33, disposed on the lower right side of the coupling device 8, attract each other, the coupling device 8 rotates by a predetermined angle clockwise around the connection point C3. Simultaneously, by such a force that the comb tooth-like electrodes 42 and 43, disposed on the upper left side of the coupling device 8, attract each other, the coupling device 8 rotates by a predetermined angle counterclockwise around the connection point C4. By this, the coupling device 8 inclines by a predetermined angle clockwise with respect to the fixing device 3, and simultaneously, the moving device 4 rotates by a predetermined angle counterclockwise with respect to the coupling device 8. The inclination amount of the coupling device 8 with respect to the fixing device 3 is equal to the rotation amount of the moving device 4 with respect to the coupling device 8.

By the cooperation among the four pairs of comb tooth-like electrodes described above, the moving device 4 moves in parallel to the right along the gentle curve shown in the arrow A direction.

As explained above, the actuator 6 is provided with: the coupling device 7 whose one edge side is rotatably connected to the connection point C1 of the fixing device 3 and whose other edge side is rotatably connected to the connection point C2 of the moving device 4; the coupling device 8 whose one edge side is rotatably connected to the connection point C3 of the fixing device 3 and whose other edge side is rotatably connected to the connection point C4 of the moving device 4; the comb tooth-like electrodes 12 whose rear anchor side is connected to the comb tooth-like base point B1 and whose tip side extends along the rotational trajectory of the comb tooth-like base point B1; and the comb tooth-like electrodes 13 whose rear anchor side is connected to the fixing device 3, whose tip side extends along the curve of the comb tooth-like electrode, and which faces the comb tooth-like electrode 12 at a predetermined interval. Moreover, in the actuator 6, the length between the connection points C1 and C2 is equal to the length between the connection points C3 and C4, and the length between the connection points C1 and C3 is equal to the length between the connection points C2 and C4.

By virtue of such construction, even if a voltage is applied between the comb tooth-like electrodes 12 and 13 to thereby displace the moving device 4 with respect to the fixing device 3, the interval does not change between the comb tooth-like electrodes 12 and 13 facing each other in the extending direction of the coupling device 7.

That is, the comb tooth-like electrodes 12 are disposed on the coupling device 7. The both edges of the coupling device 7 are connected to the connection point C1 and C2. Moreover, the length between the connection points C1 and C2 does not change all the time. Therefore, the comb tooth-like electrodes 12 do not deviate from the rotational trajectory R of the comb tooth-like base points B1 (refer to FIG. 6).

Moreover, the comb tooth-like electrodes 12 extend along the rotational trajectory R of the comb tooth-like base points B1, and the comb tooth-like electrodes 13 extend along the curve of the comb tooth-like electrodes 12. Therefore, even if the comb tooth-like electrodes 12 moves on the rotational trajectory R of the comb tooth-like base points B1, the interval between the comb tooth-like electrodes 12 and 13 is constant all the time.

According to the actuator 6 as described above, the interval between the comb tooth-like electrodes 12 and 13 facing each other in the extending direction of the coupling device 7 does not change, so that a phenomenon in which the comb tooth-like electrodes 12 and 13 facing each other come into contact, i.e. a pull-in phenomenon, does not occur. Therefore, it is possible to increase the stroke amount of the actuator 6, and it is possible to increase the reciprocation distance of the moving device 4 with respect to the fixing device 3.

Now, the actuator 6 in the embodiment is compared with the general system 200 of the electrostatically-driven actuator in FIG. 10.

In the general system 200 of the electrostatically-driven actuator, a fixing device 201 and a moving device 202 are connected by springs 203, as shown in FIG. 10. If the moving device 202 is displace in the horizontal direction while the interval between comb tooth-like electrodes 204 and 205 facing each other in the cross direction (or front-back direction) in FIG. 10 is maintained to be constant, the springs 203 extend. Thus, the springs 203 are formed to extend in the cross direction. Hence, the moving device 202 may be shifted in position in the cross direction, and may deviate from a normal trajectory. As a result, in some cases, the pull-in phenomenon occurs in which the comb tooth-like electrodes 204 and 205 facing each other come into contact. The shift in position in the cross direction of the moving device 202 tends to occur by increasing the reciprocation distance (stroke amount) in the horizontal direction of the moving device 202. Thus, the increase in the stroke amount of the moving device 202 increases the possibility of the occurrence of the pull-in phenomenon, to thereby reduce the stability and reliability of the actuator.

In contrast, in the actuator 6 in the embodiment, as shown in FIG. 1, the fixing device 3 and the moving device 4 are connected by the coupling devices 7 and 8 and the plate springs 11, 21, 31, and 41. The coupling devices 7 and 8 have sufficient strength, and do not extend in the cross direction nor curve (or bend) in the horizontal direction. Moreover, the plate springs 11 and 31 are only deformed to rotate the coupling device 7 and 8 around the connection points C1 and C3, with respect to the fixing device 3. In the same manner, the plate springs 21 and 41 are only deformed to rotate the coupling device 7 and 8 around the connection points C1 and C3, with respect to the moving device 4. Therefore, unless there is a failure in a different viewpoint from the mechanical viewpoint, such as the coupling devices 7 and 8 expanding by heat or the like, the displacement of the moving device 4 with respect to the fixing device 3 does not deviate from the normal trajectory (i.e. the trajectory of the gentle curve shown in the arrow A). Therefore, the comb tooth-like electrodes 12 and 13 facing each other in the cross direction in FIG. 1 always have a constant distance. In the same manner, the distances between the comb tooth-like electrodes 22 and 23, between the comb tooth-like electrodes 32 and 33, and between the comb tooth-like electrodes 42 and 43 are also kept constant all the time. Thus, these comb tooth-like electrodes are not in contact, so that the pull-in phenomenon does not occur. Since the pull-in phenomenon does not occur, it is possible to increase the stroke amount of the actuator 6, and it is possible to increase the reciprocation distance of the moving device 4 with respect to the fixing device 3.

Moreover, the actuator 6 has: the comb tooth-like electrodes 12 which extend along the rotational trajectory of the comb tooth-like base points B1; and the comb tooth-like electrodes 13 which curve or bend in accordance with the comb tooth-like electrodes 12. Moreover, the actuator 6 has: the comb tooth-like electrodes 22 which extend along the rotational trajectory of the comb tooth-like base points B2; and the comb tooth-like electrodes 23 which curve or bend in accordance with the comb tooth-like electrodes 22. Moreover, the actuator 6 has: the comb tooth-like electrodes 32 which extend along the rotational trajectory of the comb tooth-like base points B3; and the comb tooth-like electrodes 33 which curve or bend in accordance with the comb tooth-like electrodes 32. Moreover, the actuator 6 has: the comb tooth-like electrodes 42 which extend along the rotational trajectory of the comb tooth-like base points 34; and the comb tooth-like electrodes 43 which curve or bend in accordance with the comb tooth-like electrodes 42. That is, the actuator 6 has the four comb tooth-like electrode mechanism 10, 20, 30, and 40.

Therefore, according to the actuator 6, it is possible to obtain a large amount of driving force to displace the moving device 4, and to correctly displace the moving device 4.

Moreover, the comb tooth-like electrodes 12, 22, 32, and 42 provided for the coupling devices 7 and 8 of the actuator 6 extend from both right and left sides of the coupling devices 7 and 8.

Therefore, according to the actuator 6, it is possible to obtain a large amount of driving force to displace the moving device 4, and to correctly displace the moving device 4.

Moreover, the comb tooth-like base points B1 are disposed between the connection points C1 and C2, and the comb tooth-like base points 32 are disposed between the connection points B1 and C2. By this, the comb tooth-like electrodes 12, 13, 22, and 23 can be disposed between the connection points C1 and C2. Therefore, the comb tooth-like electrodes 12, 13, 22, and 23 can be gathered up near the center of the coupling device 7. Moreover, the comb tooth-like base points B3 are disposed between the connection points C3 and C4, and the comb tooth-like base points B4 are disposed between the connection points B3 and C4. By this, the comb tooth-like electrodes 32, 33, 42, and 43 can be disposed between the connection points C3 and C4. Therefore, the comb tooth-like electrodes 32, 33, 42, and 43 can be gathered up near the center of the coupling device 8. Thus, it is possible to reduce the actuator 6 in size.

Moreover, the length of each comb tooth-like electrode 12 of the actuator 6 increases as the distance between the comb tooth-like base point B1 corresponding to the comb tooth-like electrode 12 and the connection point C1 increases. By this, even if a voltage applied between the comb tooth-like electrodes 12 and 13 is small, it is possible to create a large driving force. Moreover, by virtue of such construction, it is possible to increase the stroke amount. The same holds true for the comb tooth-like electrodes 22, 32, and 42.

Incidentally, the actuator 6 in FIG. 1 has the four comb tooth-like electrode mechanisms 10, 20, 30, and 40. However, there may be provided one, two, or three comb tooth-like electrode mechanisms. That is, each of the connection points C1, C2, C3, and C4 are fixed, and their positional relationship is not changed all the time. Therefore, if a force in a predetermined direction is applied to any one point on the coupling device 7 or 8 except the connection points C1, C2, C3, and C4, it is possible to displace in parallel the moving device 4 along the arrow A with respect to the fixing device 3. Thus, there may be provided one comb tooth-like electrode mechanism.

However, providing a plurality of comb tooth-like electrode mechanisms allows a large driving force or a high accuracy in displacing the moving device 4. As shown in FIG. 1, by arranging the four comb tooth-like electrode mechanisms 10, 20, 30, and 40, which have substantially the same structure, symmetrically to almost the center of the fixing device 3, it is possible to generate driving forces in a balanced manner, and to create a large driving force obtained by joining the driving forces. By this, it is possible to displace the moving device 4, stably and highly accurately, with respect to the fixing device 3.

Moreover, in the comb tooth-like electrode mechanism 10 of the actuator 6 in FIG. 1, the length in the extending direction of each of the comb tooth-like electrodes 12 and 13 increases as the distance between the comb tooth-like base point B1 corresponding to the comb tooth-like electrode 12 and the connection point C1 increases. By this, the comb tooth-like electrode mechanism 10 is in a skirt shape in the outside shape. However, the length in the extending direction of each of the comb tooth-like electrodes 12 and 13 may be constant. Moreover, like a comb tooth-like electrode mechanism 70 shown in FIG. 7, the length in the extending direction of each of the comb tooth-like electrodes 12 and 13 may be partially constant. By this, it is possible to reduce the comb tooth-like electrode mechanism 70 in size in the horizontal direction in FIG. 7, and it is possible to provide the comb tooth-like electrode mechanism 70 in a small space. The same is true for the comb tooth-like electrode mechanisms 20, 30, and 40.

Moreover, in the actuator 6 in FIG. 1, the plate springs 11, 21, 31, and 41 are used to connect the coupling device 7 and 8 and the fixing device 3, and the coupling device 7 and 8 and the moving device 4. However, instead of the plate springs 11, 21, 31, and 41, a rotation spring 61 may be used.

Moreover, in the actuator 6 in FIG. 1, the fixing device 3 and the moving device 4 are coupled by the two coupling device 7 and 8. However, there may be provided one, or three or more coupling devices.

However, if there is provided one coupling device, it is provided with: a first comb tooth-like electrode mechanism for rotating the coupling device with respect to the fixing device 3; and a second comb tooth-like electrode mechanism for rotating the moving device 4 with respect to the coupling device. Then, in order to realize the parallel displacement of the moving device 4, the coupling device is rotated by a predetermined angle with respect to the fixing device 3 by the first comb tooth-like electrode mechanism, and simultaneously, the moving device 4 is rotated by a predetermined angle with respect to the coupling device by the second comb tooth-like electrode mechanism.

Moreover, the actuator 6 in FIG. 1 is used as a driving source for displacing the recording medium 5 with respect to the probe head 52. However, the actuator 6 can be used as a driving source for displacing the probe head with respect to the recording medium. Moreover, the actuator 6 can be applied not only to the scanning probe memory apparatus but also to another apparatus.

Moreover, the comb tooth-like electrode mechanisms 10, 20, 30, and 40 of the actuator 6 in FIG. 1 are used to create a driving force for displacing the moving device 4 with respect to the fixing device 3. The present invention, however, is not limited to this. For example, another driving mechanism for realizing the rotary motion of the coupling devices 7 and 8 with respect to the fixing device 3 (inclining motion) and the rotary motion of the moving device 4 with respect to the coupling devices 7 and 8 may be added to the actuator 6, and the comb tooth-like electrode mechanisms 10, 20, 30, and 40 may be used to measure the rotation angle (inclining angle) of the coupling devices 7 and 8, the rotation angle of the moving device 4, the moving distance of the moving device 4 with respect to the fixing device 3, or the like.

Embodiment of Actuator System

FIG. 9 shows the inside of a scanning probe memory apparatus equipped with an actuator system in an embodiment of the present invention.

As shown in FIG. 9, an actuator system 80 is provided with: a fixing device 81; a moving device 82 equipped with a fixing block 83 and a moving block 84; a first actuator 100 for displacing the moving block 84 in an X direction parallel to the upper surface of the moving block 84, with respect to the fixing block 83; and a second actuator 120 for displacing the moving device 82 in a Y direction crossing the X direction in the same plane, with respect to the fixing device 81. Incidentally, the arrow X draws a gentle curve, and the arrow Y also draws a gentle curve.

Each of the first actuator 100 and the second actuator 120 has substantially the same structure as that of the actuator 6 in FIG. 1. That is, the first actuator 100 is provided with: a coupling device 101; comb tooth-like electrode mechanisms 111 and 112; a coupling device 102; and comb tooth-like electrode mechanisms 113 and 114.

The second actuator 120 is provided with: a coupling device 121; comb tooth-like electrode mechanisms 131 and 132; a coupling device 122; and comb tooth-like electrode mechanisms 133 and 134. Moreover, the comb tooth-like electrode mechanisms 131, 132, 133, and 134 of the second actuator 120 adopt the same structure as that of the comb tooth-like electrode mechanism 70 shown in FIG. 7.

The first actuator 100 drives the moving lock 84 with a relatively large and stable driving force in the arrow X direction with respect to the fixing block 83, by the skirt-shaped comb tooth-like electrode mechanisms 111, 112, 113, and 114. On the other hand, the second actuator 120 displaces the moving device 82 in the arrow Y direction with respect to the fixing device 81.

If the actuator system 80 is applied to the scanning probe memory apparatus, a recording medium 130 is disposed in the center of the moving block 84. By this, the recording medium 130 can be displaced in the arrow X direction by the drive of the first actuator 100. Moreover, the recording medium 130 can be displaced in the arrow Y direction by the drive of the second actuator 120.

The first actuator 100 can drive the moving lock 84 with a relatively large and stable driving force in the arrow X direction with respect to the fixing block 83, by the skirt-shaped comb tooth-like electrode mechanisms 111, 112, 113, and 114. Thus, the first actuator 100 is suitable to reciprocate the recording medium 130, constantly, along the extending direction of a track. On the other hand, the second actuator 120 is suitable to displace the recording medium 130, intermittently or temporarily, in the direction crossing the extending direction of the track.

According to the actuator system 80, it is possible to prevent the occurrence of the pull-in phenomenon in which the comb tooth-like electrodes facing each other in the extending direction of the coupling devices 101 and 102 of the first actuator 100 come in contact. Therefore, it is possible to increase the moving distance (or stroke amount) in the arrow X direction of the moving block 84 or the recording medium 130.

Moreover, according to the actuator system 80, it is possible to prevent the occurrence of the pull-in phenomenon in which the comb tooth-like electrodes facing each other in the extending direction of the coupling devices 121 and 122 of the second actuator 120 come in contact. Therefore, it is possible to increase the moving distance (or stroke amount) in the arrow Y direction of the moving device 82 or the recording medium 130.

Incidentally, in the present invention, various changes may be made, if desired, without departing from the essence or spirit of the invention which can be read from the claims and the entire specification. An actuator, which involves such changes, is also intended to be within the technical scope of the present invention.

INDUSTRIAL APPLICABILITY

The actuator using comb teeth according to the present invention can be applied to an actuator suitably used for a scanning probe memory apparatus, for example.

The invention claimed is:

1. An actuator for displacing a moving device in a predetermined direction with respect to a fixing device, comprising:
   a first coupling device whose one edge side is rotatably connected to a first connection point disposed on said fixing device and whose other edge side is rotatably connected to a second connection point disposed on said moving device;
   a second coupling device whose one edge side is rotatably connected to a third connection point disposed on said fixing device and whose other edge side is rotatably connected to a fourth connection point disposed on said moving device;
   a first comb tooth-like base point disposed on said first coupling device;
   a first comb tooth whose rear anchor side is connected to said first comb tooth-like base point and whose tip side extends along a rotational trajectory of said first comb tooth-like base point drawn by rotation around the first connection point of said first coupling device; and
   a second comb tooth whose rear anchor side is connected to said fixing device and whose tip side extends in accordance with a curve of said first comb tooth, said second comb tooth facing said first comb tooth at a predetermined interval;
   a second comb tooth-like base point disposed on said first coupling device;
   a third comb tooth whose rear anchor side is connected to said second comb tooth-like base point and whose tip side extends along a rotational trajectory of said second comb tooth-like base point drawn by rotation around the second connection point of said first coupling device; and
   a fourth comb tooth whose rear anchor side is connected to said moving device and whose tip side extends in accordance with a curve of said third comb tooth, said fourth comb tooth facing said third comb tooth at a predetermined interval,
   a length between the first connection point and the second connection point being equal to a length between the third connection point and the fourth connection point, a length between the first connection point and the third connection point being equal to a length between the second connection point and the fourth connection point.

2. The actuator according to claim 1, comprising:
   a third comb tooth-like base point disposed on said second coupling device;
   a fifth comb tooth whose rear anchor side is connected to said third comb tooth-like base point and whose tip side extends along a rotational trajectory of said third comb tooth-like base point drawn by rotation around the third connection point of said second coupling device; and
   a sixth comb tooth whose rear anchor side is connected to said fixing device and whose tip side extends in accordance with a curve of said fifth comb tooth, said sixth comb tooth facing said fifth comb tooth at a predetermined interval.

3. The actuator according to claim 2, comprising:
   a fourth comb tooth-like base point disposed on said second coupling device;
   a seventh comb tooth whose rear anchor side is connected to said fourth comb tooth-like base point and whose tip side extends along a rotational trajectory of said fourth comb tooth-like base point drawn by rotation around the fourth connection point of said second coupling device; and
   an eighth comb tooth whose rear anchor side is connected to said moving device and whose tip side extends in accordance with a curve of said seventh comb tooth, said eighth comb tooth facing said seventh comb tooth at a predetermined interval.

4. The actuator according to claim 1, wherein said first comb tooth extends from each of both sides of said first coupling device.

5. The actuator according to claim 1, wherein said third comb tooth extends from each of both sides of said first coupling device.

6. The actuator according to claim 2, wherein said fifth comb tooth extends from each of both sides of said second coupling device.

7. The actuator according to claim 3, wherein said seventh comb tooth extends from each of both sides of said second coupling device.

8. The actuator according to claim 1, wherein
   said first comb tooth-like base point is disposed between the first connection point and the second connection point, and said second comb tooth-like base point is disposed between the first connection point and the second connection point.

9. The actuator according to claim 3, wherein
said third comb tooth-like base point is disposed between the third connection point and the fourth connection point, and
said fourth comb tooth-like base point is disposed between the third connection point and the fourth connection point.

10. The actuator according to claim 1, wherein
said first coupling device is provided with a plurality of first comb tooth-like base points,
each of the plurality of first comb tooth-like base points is connected to respective one of the first comb teeth, and
a length of each first comb tooth increases as a distance between said first comb tooth-like base point corresponding to the first comb tooth and the first connection point increases.

11. The actuator according to claim 1, wherein
said first coupling device is provided with a plurality of second comb tooth-like base points,
each of the plurality of second comb tooth-like base points is connected to respective one of the third comb teeth, and
a length of each third comb tooth increases as a distance between said second comb tooth-like base point corresponding to the third comb tooth and the second connection point increases.

12. The actuator according to claim 2, wherein
said second coupling device is provided with a plurality of third comb tooth-like base points,
each of the plurality of third comb tooth-like base points is connected to respective one of the fifth comb teeth, and
a length of each fifth comb tooth increases as a distance between said third comb tooth-like base point corresponding to the fifth comb tooth and the third connection point increases.

13. The actuator according to claim 3, wherein
said second coupling device is provided with a plurality of fourth comb tooth-like base points,
each of the plurality of fourth comb tooth-like base points is connected to respective one of the seventh comb teeth, and
a length of each seventh comb tooth increases as a distance between said fourth comb tooth-like base point corresponding to the seventh comb tooth and the fourth connection point increases.

14. The actuator according to claim 1, wherein said moving device is displaced with respect to said fixing device by an electrostatic force generated by applying a potential difference between said first comb tooth and said second comb tooth.

15. An actuator for displacing a moving device in a predetermined direction with respect to a fixing device, comprising:
a coupling device whose one edge side is rotatably connected to a first connection point disposed on said fixing device and whose other edge side is rotatably connected to a second connection point disposed on said moving device;
a first comb tooth-like base point disposed on said coupling device;
a first comb tooth whose rear anchor side is connected to said first comb tooth-like base point and whose tip side extends along a rotational trajectory of said first comb tooth-like base point drawn by rotation around the first connection point of said coupling device;
a second comb tooth whose rear anchor side is connected to said fixing device and whose tip side extends in accordance with a curve of said first comb tooth, said second comb tooth facing said first comb tooth at a predetermined interval;
a second comb tooth-like base point disposed on said coupling device;
a third comb tooth whose rear anchor side is connected to said second comb tooth-like base point and whose tip side extends along a rotational trajectory of said second comb tooth-like base point drawn by rotation around the second connection point of said coupling device; and
a fourth comb tooth whose rear anchor side is connected to said moving device and whose tip side extends in accordance with a curve of said third comb tooth, said fourth comb tooth facing said third comb tooth at a predetermined interval.

16. The actuator according to claim 15, wherein said first comb tooth extends from each of both sides of said coupling device.

17. The actuator according to claim 15, wherein said third comb tooth extends from each of both sides of said coupling device.

18. The actuator according to claim 15, wherein
said first comb tooth-like base point is disposed between the first connection point and the second connection point, and
said second comb tooth-like base point is disposed between the first connection point and the second connection point.

19. The actuator according to claim 15, wherein
said coupling device is provided with a plurality of first comb tooth-like base points,
each of the plurality of first comb tooth-like base points is connected to respective one of the first comb teeth, and
a length of each first comb tooth increases as a distance between said first comb tooth-like base point corresponding to the first comb tooth and the first connection point increases.

20. The actuator according to claim 15, wherein
said coupling device is provided with a plurality of second comb tooth-like base points,
each of the plurality of second comb tooth-like base points is connected to respective one of the third comb teeth, and
a length of each third comb tooth increases as a distance between said second comb tooth-like base point corresponding to the third comb tooth and the second connection point increases.

21. The actuator according to claim 15, wherein said moving device is displaced with respect to said fixing device by an electrostatic force generated by applying a potential difference between said first comb tooth and said second comb tooth and between said third comb tooth and said fourth comb tooth.

22. An actuator system comprising:
a fixing device;
a moving device comprising a fixing block and a moving block;
a first actuator for displacing said moving device in a first direction with respect to said fixing device; and
a second actuator for displacing the moving block in a second direction crossing the first direction in the same plane, with respect to the fixing block,
wherein said first actuator and said second actuator being the actuator according to claim 1.

* * * * *